United States Patent [19]

Suzuki

[11] Patent Number: 4,886,763

[45] Date of Patent: Dec. 12, 1989

[54] DEVICE ISOLATION BY ETCHING TRENCH IN DIELECTRIC ON SUBSTRATE AND EPITAXIALLY FILLING THE TRENCH

[75] Inventor: Ken-ichi Suzuki, Tokyo, Japan

[73] Assignee: Oki Electric Industry Co., Ltd., Tokyo, Japan

[21] Appl. No.: 233,580

[22] Filed: Aug. 18, 1988

[30] Foreign Application Priority Data

Aug. 21, 1987 [JP] Japan .................................. 62-206441

[51] Int. Cl.[4] ...................... H01L 21/20; H01L 21/76
[52] U.S. Cl. ........................................ 437/61; 437/67; 437/89
[58] Field of Search ............................ 437/61, 67, 89; 156/657, 662

[56] References Cited

U.S. PATENT DOCUMENTS 4,502,914 3/1985 Trumpp et al. ........................ 437/67

FOREIGN PATENT DOCUMENTS

| 59-5644 | 1/1984 | Japan | 437/89 |
| 59-5645 | 1/1984 | Japan | 437/89 |
| 59-57450 | 4/1984 | Japan | 437/89 |
| 59-121952 | 7/1984 | Japan | 437/89 |
| 59-232440 | 12/1984 | Japan | 437/67 |
| 63-114158 | 5/1988 | Japan | 437/67 |
| 8701239 | 2/1987 | PCT Int'l Appl. | 437/89 |

*Primary Examiner*—Olik Chaudhuri
*Attorney, Agent, or Firm*—Wenderoth, Lind & Ponack

[57] ABSTRACT

A method of forming dielectric isolation regions includes the steps of forming a first dielectric layer having a groove on a semiconductor substrate, forming a second dielectric film on the entire surface including the groove, and forming dielectric isolation regions by utilizing the second dielectric film formed on side walls of the grooves as an isolation region.

16 Claims, 7 Drawing Sheets

PRIOR ART

DEVICE ISOLATION BY ETCHING TRENCH IN DIELECTRIC ON SUBSTRATE AND EPITAXIALLY FILLING THE TRENCH

BACKGROUND OF THE INVENTION

1. Field of the Invention

This invention relates to a method of forming dielectric isolation regions and which is applicable to fabrication of substantially all semiconductor devices such as MOS devices, bipolar devices and the like.

2. Description of the Prior Art

Figure 1A:
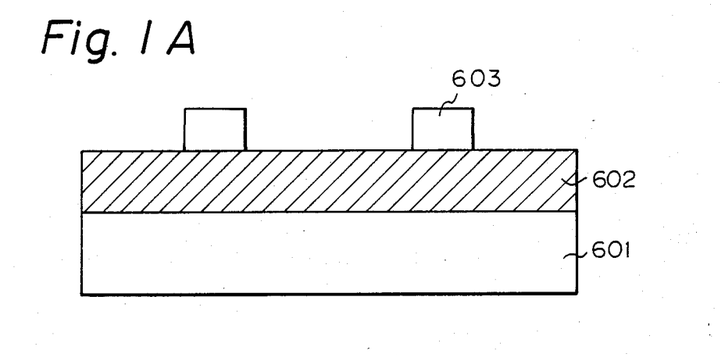
FIGS. 1(A) to 1(C) are, respectively, sectional views illustrating a conventional method of forming a dielectric isolation region by a selective epitaxial growth technique.
Figure 1B:
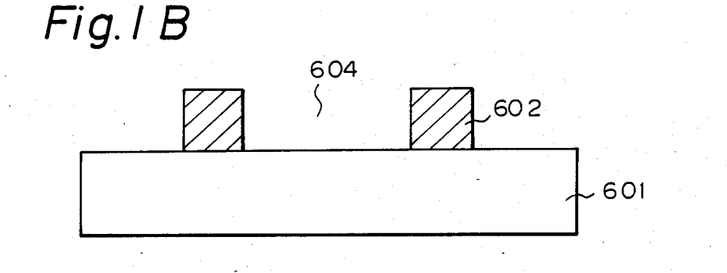
Figure 1C:
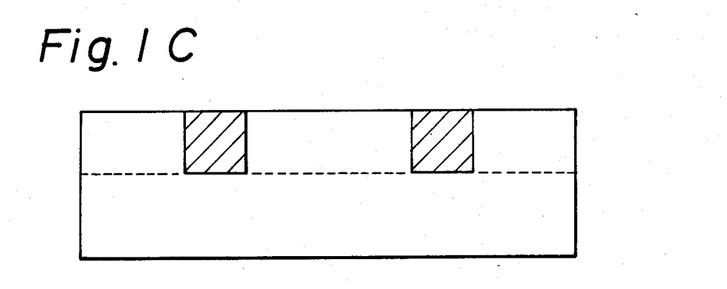

For the formation of dielectric isolation regions, there is known a method in which single crystal silicon is selectively epitaxially grown. This method is described with reference to FIG. 1. First, a silicon oxide film 602 is formed on a silicon substrate 601 by thermal oxidation or CVD, on which is further formed a photoresist pattern 603 serving as an isolation region (FIG. 1(A)). Subsequently, the silicon oxide film 602 is etched substantially vertically by a reactive ion etching technique (hereinafter referred to simply as RIE method) through the photoresist pattern 603 as a mask to form an opening 604 for use as an element region (FIG. 1(B)). Next, single crystal silicon is selectively epitaxially grown on the exposed portion of the silicon substrate 601 by a selective epitaxial growth technique, thereby completely filling the opening 604 (FIG. 1(C)).

The above selective epitaxial growth method has recently attracted attention because fine isolation regions can be formed. For instance, this method has been reported in The Solid State Technology, Japanese Edition, October, 1985, PP. 43–67, under the title of "Improved Dielectric Isolation Method Using Selective Epitaxial Growth".

The selective epitaxial growth method is a simpler process than the trench separation method in which a groove is formed in a silicon substrate and is utilized as an isolation region. However, the selective epitaxial growth method involves the disadvantage that the width of the isolation region is regulated with the processing accuracy of a photoetching technique, so that formation of a finer isolation region is difficult.

SUMMARY OF THE INVENTION

An object of the present invention is to provide a method of forming a fine dielectric isolation region.

Another object of the invention is to provide a method of forming a dielectric separation region which is simple in process and by which self-aligned element regions can be formed.

The above objects can be achieved, according to the present invention, by a method of forming a semiconductor substrate having dielectric isolation regions, comprising the steps of:

(a) forming a second dielectric layer on a silicon substrate having a first dielectric layer, the second dielectric layer being of a material which is different from that of the first dielectric layer having therein a first opening;

(b) forming on the body obtained in step (a) a resist layer having a second opening which is partially superposed on the first opening;

(c) forming a first groove by etching in the first dielectric layer using the resist layer and the second dielectric layer as a mask so that a surface of the substrate is exposed;

(d) after removal of the resist layer, forming on the body obtained in step (c) a third dielectric layer of a material which is different from the first dielectric layer;

(e) etching the third dielectric layer by an RIE method such that the third dielectric layer is left only on side walls of the first groove and of the second dielectric layer;

(f) subjecting the body obtained in step (e) to reactive ion etching to form a second groove in the first opening, which is not superposed with the second opening, so that a surface of the substrate is exposed;

(g) epitaxially depositing a single crystal silicon in the first and second grooves to a thickness which is substantially the same as a thickness of the first dielectric layer; and (h) removing the third dielectric layer and second dielectric layer disposed on side walls of the third dielectric layer.

The above and other objects, features and advantages of the present invention will become more apparent from the following description taken in conjunction with the accompanying drawings.

DESCRIPTION OF THE PREFERRED EMBODIMENT

Reference is now made to FIGS. 2(A) to 2(H) and FIGS. 3(A) and 3(B), in which a first embodiment of the presnt invention is depicted.

In the first step, an about 1 micrometer thick silicon oxide film 102 is formed on a silicon substrate 101 by a CVD method or a thermal oxidation method. Subsequently, an about 5000 angstrom thick silicon nitride film 103 is deposited on the silicon oxide film 102 by a reduced pressure CVD method in which $SiH_2Cl_2$ and $NH_3$ gas are used for treatment under conditions of 500 mTorr and 700° to 800° C. The first silicon nitride film 103 is partially removed by photoetching to form an opening 104 (FIG. 2(A)).

Figure 2A:
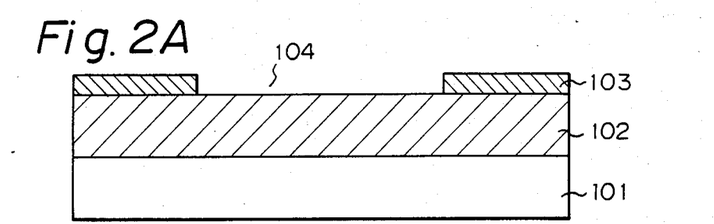
FIGS. 2(A) to 2(H) are, respectively, sectional views illustrating a process according to a first embodiment of the present invention.
Figure 2B:
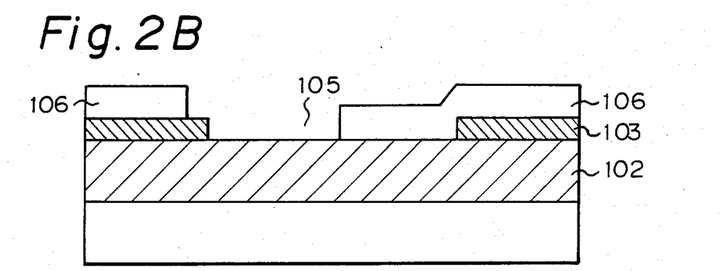
Figure 2C:
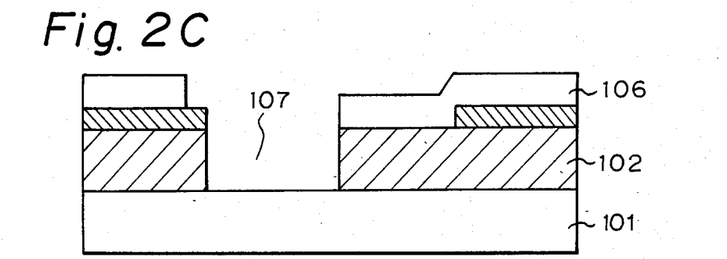
Figure 3A:
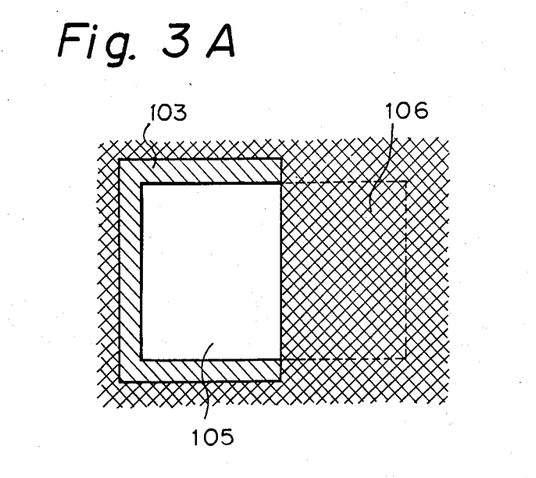
FIGS. 3(A) and 3(B) are, respectively, plan views illustrating the first embodiment of the present invention.
Figure 3B:
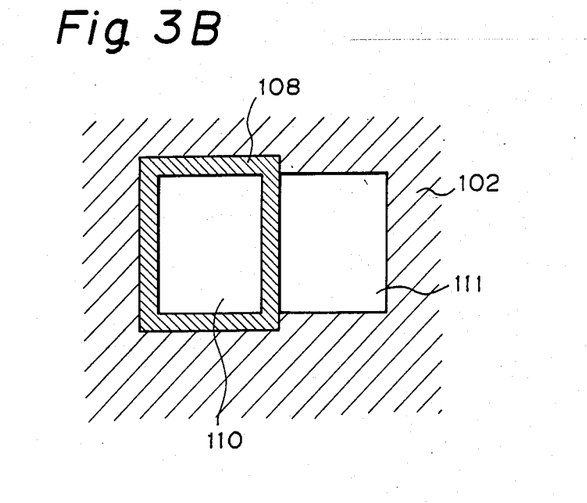

After formation of an about 1 micrometer thick photoresist on the body of FIG. 2(A), the resist is selectively removed by photolithography to form an opening 105 (FIGS. 2(B) and 3(A)). The opening 105 causes not only the silicon oxide film 102 but also the first nitride film 103 to be exposed as shown. The exposed portion of the silicon oxide 102 is a portion which forms a first element region. The exposed first nitride film 103 serves as a mask when the first element region is formed.

The exposed silicon oxide film 102 is subjected to anisotropic etching by the RIE method using the first nitride film 103 and the photoresist 106 as a mask. By such etching, there is formed a first groove 107 which has substantially vertical side walls and has as a bottom an exposed portion of the silicon substrate 101 (FIG. 2(C)).

Figure 2D:
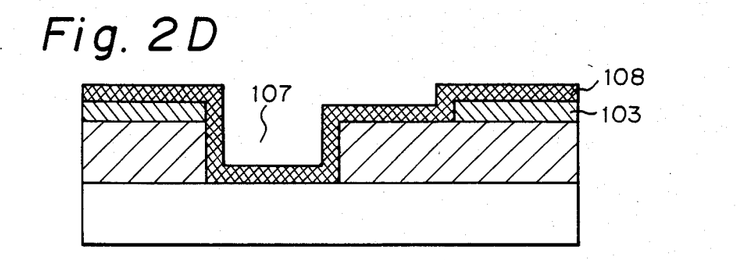
Figure 2E:
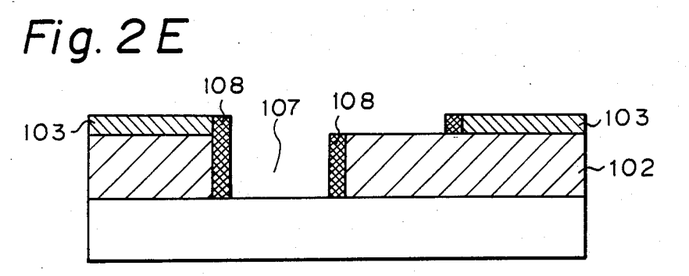

After removal of the photoresist 106, an about 3000 to 5000 angstrom thick silicon nitride film 108 is formed by the same method as with the first silicon nitride film (FIG. 2(D)).

Next, the second nitride film 108 is subjected to anisotropic etching by the RIE method. This etching is effected using a parallel-plane type plasma etching appratus in which $C_2F_6$ and $CHF_3$ gases are applied under conditions of 2 to 10 Pa. and 300 to 400 W. By such etching, the regions of second nitride film 108 disposed on the bottom of the first groove 107, on the first nitride film 103 and on the oxide film 102 are selectively removed, while leaving the second nitride film 108 on the side walls of the first groove 107 and the first nitride film 103. Part of the oxide film 102, which is a portion of the region of the opening 104, is exposed (FIG. 2(E)).

Figure 2F:
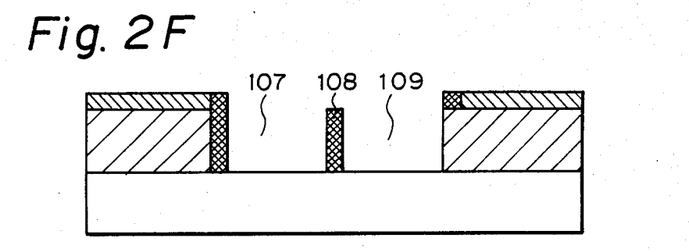
Figure 2G:
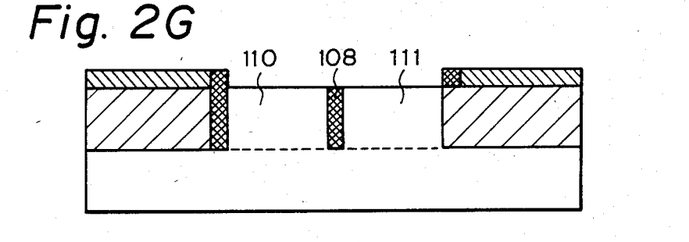

The exposed oxide film 102 is removed by the RIE method through a mask of the first nitride film 103 and the remaining second nitride film 108 to form a second groove 109 (FIG. 2(F)).

A single crystal silicon is selectively epitaxially deposited on the bottoms of the first groove 107 and the second groove 109, which are exposed portions of the silicon substrate 101. This selective epitaxial growth is effected under conditions of 800° to 100° C. and not larger than 100 Torr., in an atmosphere to which 0.5 to 2.0% of HCl gas is added to $H_2$ gas containing 1% of $SiH_2Cl_2$ gas. As a result, the first groove 107 and the second groove 109 are filled with the single crystal silicon. The filled portions are, respectively, a first element region 110 and a second element region 111 (FIG. 2(G)).

Finally, the first nitride film 103 on the oxide film 102 and the second nitride film 108 formed on the side walls of the first nitride film 103 are removed by anisotropic etching according to the RIE method. Thus, the resultant isolation construction has the narrow isolation regions and the wide regions with a flat surface (FIG. 2(H) and FIG. 3(B)).

Figure 2H:
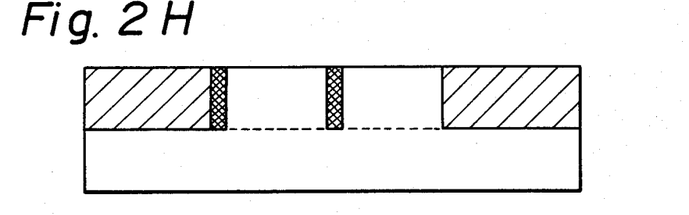

In the isolation construction, the first and second element regions 110, 111 are isolated from each other by means of the second nitride film 108. Since the second nitride film 108 is formed by the reduced pressure CVD technique, the film thickness can be freely controlled with the possibility of thin film formation.

A second embodiment of the invention is described with reference to FIGS. 4(A) to 4(H) and FIGS. 5(A) and 5(B).

The second embodiment is different in pattern from the first embodiment but is the same as the first embodiment with respect to the thicknesses of the respective films, formation conditions and etching conditions. Accordingly, differences alone are described.

Figure 4A:
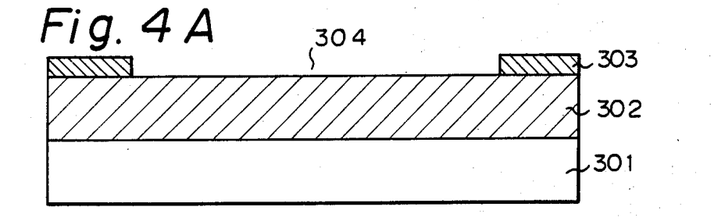
FIGS. 4(A) to 4(H) are, respectively, sectional views illustrating a process according to a second embodiment of the present invention.
Figure 4B:
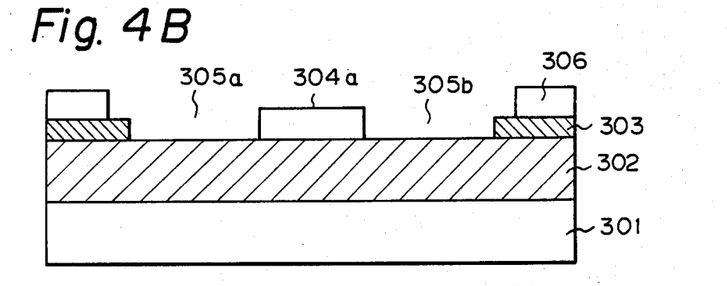

A photoresist 306 is formed on a central portion 304a of an opening 304 of FIG. 4(A) and on a first silicon nitride film 303 to form exposed portions of a silicon oxide film 302, i.e. at openings 305a, 305b (FIG. 4(B)).

Figure 4C:
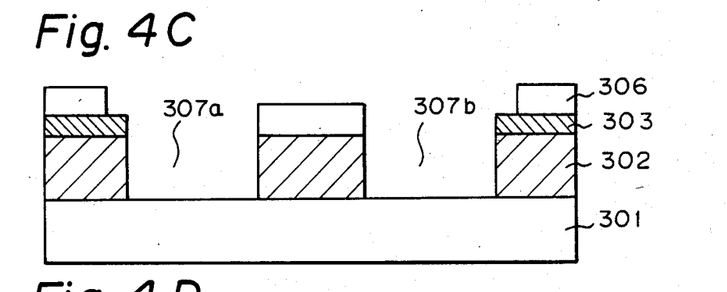

The exposed silicon oxide film 302 is anisotropically etched and removed by the RIE method to form openings 307a, 307b (FIG. 4(C)).

Figure 4D:
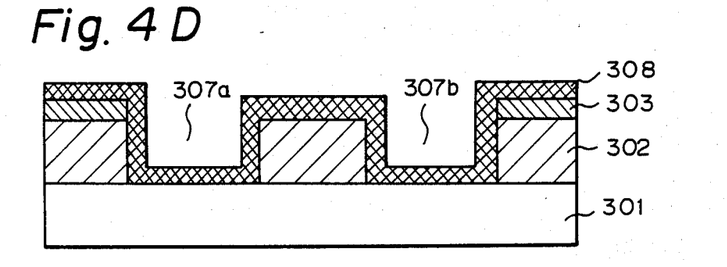

After removal of the photoresist 306, a second nitride film 308 is formed (FIG. 4(D)).

Figure 4E:
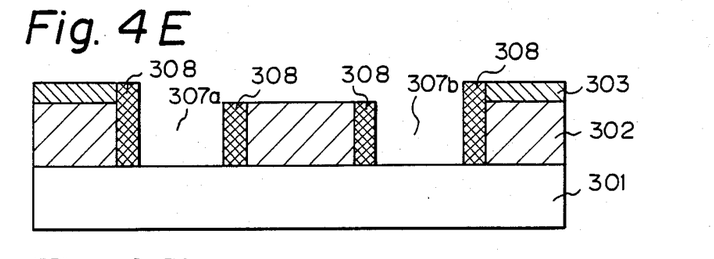

Subsequently, the second nitride film 308 is subjected to aniostropic etching according to the RIE method to leave the second nitride film 308 only on the side walls of the first and second grooves 307a, 307b (FIG. 4(E)).

Figure 4F:
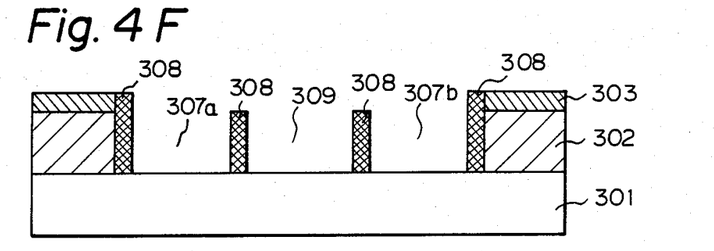
Figure 4G:
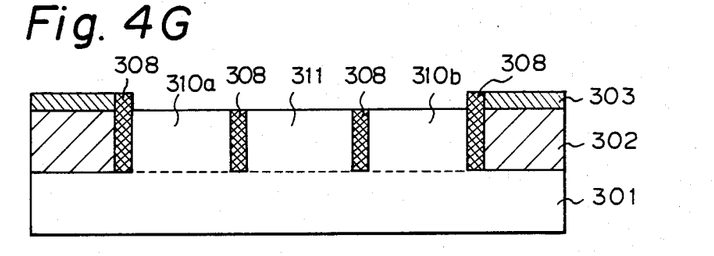

The exposed oxide film 302 is removed to form a third groove 309 (FIG. 4(F)), after which a single crystal silicon is selectively epitaxially deposited in the grooves 307a, 307b and 309 (FIG. 4(G)).

Figure 4H:
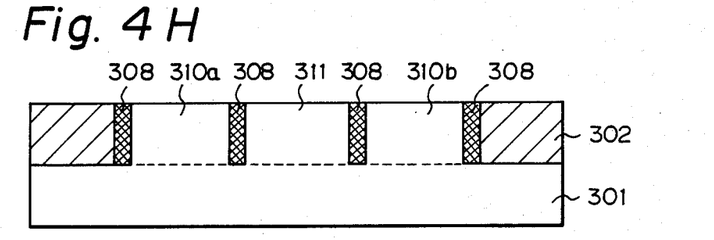
Figure 5A:
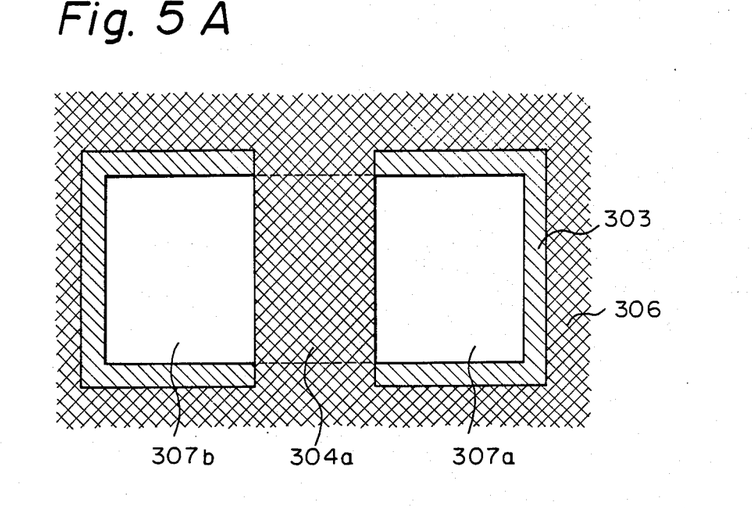
FIGS. 5(A) to 5(B) are, respectively, plan views illustrating the second embodiment of the present invention.
Figure 5B:
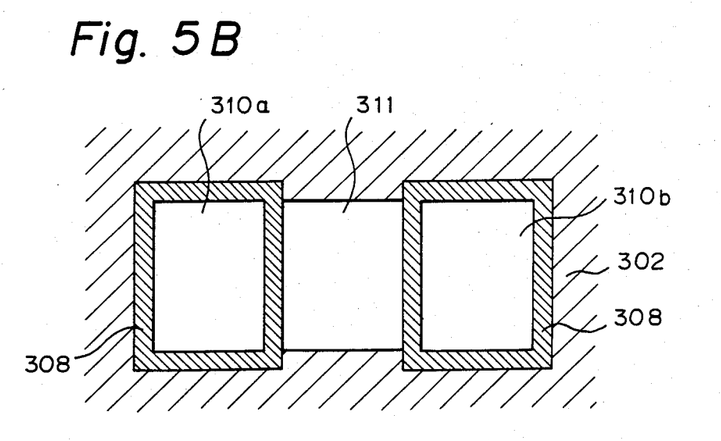

Finally, the unnecessary nitride film is removed to complete a dielectric isolation construction having three element regions 310a, 311 an 310b (FIGS. 4(H) an 5(B)).

In the second embodiment, the three element regions which are isolated with the thin nitride films 308 are obtained. By application modification of the first and second embodiments, a desired number of element regions isolated with thin nitride films can be obtained.

As will be apparent from the foregoing, since the isolation regions which isolate element regions from one another can be controlled in width by a formed film thickness, and not by a pattern width formed by photoetching, a fine and deep isolation construction can be obtained.

The element region is determined by the opening of the first nitride film and the opening of the photoresist, so that self-aligned element regions can be formed without use of any additional mask. The method of the invention ensures an isolation region of a thickness on the order of submicrons.

Although the present invention has been described in its preferred form with a certain degree of particularity, it is to be understood that many variations and changes are possible in the invention without departing from the scope thereof.

What is claimed is:

1. A method of forming a semiconductor device having dielectric isolation regions, said method comprising the steps of:
   (a) forming a first dielectric layer on a semiconductor substrate;
   (b) forming a second dielectric layer on selected portions of said first dielectric layer so that a part of said first dielectric layer is exposed;
   (c) forming a resist layer on selected portions of said second dielectric layer and on a part of the exposed portion of said first dielectric layer so that another part of said exposed part of said first dielectric layer is exposed;
   (d) subjecting said exposed part of said first dielectric layer obtained in step (c) to reactive ion etching to expose a surface of said semiconductor substrate so that at least one first groove is formed in said first dielectric layer;
   (e) removing said resist layer to expose said first and second dielectric layers;
   (f) forming a third dielectric layer on the entire surface of the structure obtained in step (e);
   (g) subjecting said third dielectric layer to reactive ion etching such that said third dielectric layer is left only on side walls of said first groove and of said second dielectric layer;
   (h) subjecting the body obtained in step (g) to reactive ion etching to form at least one second groove in said first dielectric layer so that a surface of said substrate is exposed;
   (i) epitaxially depositing a single crystal semiconductor material in said first and second grooves to a thickness which is substantially the same as the thickness of said first dielectric layer; and (j) removing said third dielectric layer and portions of said second dielectric layer disposed on side walls of said third dielectric layer.

2. A method of forming a semiconductor device having dielectric isolation regions according to claim 1, wherein said first dielectric layer is a silicon oxide film, and said second and third dielectric layers are silicon nitride films.

3. A method of forming a semiconductor device having dielectric isolation regions according to claim 2, wherein said silicon oxide film has a thickness of 1 micrometer and each said silicon nitride film has a thickness of 5000 angstroms.

4. A method of forming a semiconductor device having dielectric isolation regions according to claim 2, wherein said silicon oxide film is formed by thermal oxidation.

5. A method of forming a semiconductor device having dielectric isolation regions according to claim 2, wherein said silicon oxide film is formed by a CVD method.

6. A method of forming a semiconductor device having dielectric isolation regions according to claim 1, wherein said reactive ion etching of said third dielectric layer is effected using a parallel-plane type plasma etching apparatus.

7. A method of forming a semiconductor device having dielectric isolation regions according to claim 1, wherein a plurality of said first grooves are formed.

8. A method of forming a semiconductor device having dielectric isolation regions according to claim 1, wherein a plurality of said second grooves are formed.

9. A method of forming a semiconductor substrate having dielectric isolation regions, said method comprising the steps of:

forming a first dielectric layer on a silicon substrate;

(b) forming a second dielectric layer with a first opening therein on said first dielectric layer, said second dielectric layer being of a material which is different from that of said first dielectric layer and selectively etchable relative thereto;

forming on the surface of the structure obtained in step (b) a resist layer having a second opening which is partially superposed over said first opening;

(d) forming at least one first groove by etching in said first dielectric layer using said resist layer and said second dielectric layer as a mask so that a surface of said substrate is exposed;

(e) removing said resist layer and thereafter forming on the entire surface of the structure obtained in step (d) a third dielectric layer of a material which is different from that of said first dielectric layer and selectively etchable relative thereto;

(f) etching said third dielectric layer by an RIE method such that said third dielectric layer is left only on side walls of said first groove and of said second dielectric layer;

(g) subjecting the structure obtained in step (f) to reactive ion etching to form at least one second groove in said first opening at a position that is not superposed with said second opening, so that a surface of said substrate is exposed;

(h) epitaxially depositing a single crystal silicon in said first and second grooves to a thickness which is substantially the same as the thickness of said first dielectric layer; and (i) removing said third dielectric layer and portions of said second dielectric layer disposed on side walls of said third dielectric layer.

10. A method of forming a semiconductor substrate having dielectric isolation regions according to claim 9, wherein said first dielectric layer is a silicon oxide film and said second and third dielectric layers are silicon nitride films.

11. A method of forming a semiconductor substrate having dielectric isolation regions according to claim 10, wherein said silicon oxide film has a thickness of 1 micrometer and each said silicon nitride film has a thickness of 5000 angstroms.

12. A method of forming a semiconductor substrate having dielectric isolation regions according to claim 10, wherein said silicon oxide film is formed by thermal oxidation.

13. A method of forming a semiconductor substrate having dielectric isolation regions according to claim 10, wherein said silicon oxide film is formed by a CVD method.

14. A method of forming a semiconductor substrate having dielectric isolation regions according to claim 9, wherein said reactive ion etching of said third dielectric layer is effected using a parallel-plane type plasma etching apparatus.

15. A method of forming a semiconductor substrate having dielectric isolation regions according to claim 9, wherein a plurality of said first grooves are formed.

16. A method of forming a semiconductor substrate having dielectric isolation regions according to claim 9, wherein a plurality of said second grooves are formed.

* * * * *